(12) United States Patent
Cheng et al.

(10) Patent No.: US 9,401,583 B1
(45) Date of Patent: Jul. 26, 2016

(54) LASER STRUCTURE ON SILICON USING ASPECT RATIO TRAPPING GROWTH

(71) Applicant: International Business Machines Corporation, Armonk, NY (US)

(72) Inventors: Cheng-Wei Cheng, White Plains, NY (US); Effendi Leobandung, Stormville, NY (US); Ning Li, White Plains, NY (US); Devendra K. Sadana, Pleasantville, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/672,299

(22) Filed: Mar. 30, 2015

(51) Int. Cl.
*H01L 21/00* (2006.01)
*H01S 5/323* (2006.01)
*H01S 5/026* (2006.01)
*H01S 5/32* (2006.01)

(52) U.S. Cl.
CPC ........... *H01S 5/32316* (2013.01); *H01S 5/0268* (2013.01); *H01S 5/3211* (2013.01)

(58) Field of Classification Search
CPC .. H01S 5/32316; H01S 5/0268; H01S 5/3211
See application file for complete search history.

(56) References Cited

U.S. PATENT DOCUMENTS

| 4,943,970 | A | * | 7/1990 | Bradley | ................ | H01S 5/1835 |
| | | | | | | 257/191 |
| 7,951,299 | B2 | | 5/2011 | Hossein-Zadeh et al. |
| 8,084,337 | B2 | | 12/2011 | Samuelson et al. |
| 8,213,751 | B1 | | 7/2012 | Ho et al. |
| 8,304,805 | B2 | | 11/2012 | Lochtefeld |
| 8,306,372 | B2 | * | 11/2012 | Kondou | ................. | G02B 6/126 |
| | | | | | | 385/1 |
| 8,357,926 | B2 | | 1/2013 | Wang et al. |
| 8,384,196 | B2 | | 2/2013 | Cheng et al. |
| 2003/0089917 | A1 | * | 5/2003 | Krames | ................... | H01L 33/32 |
| | | | | | | 257/98 |
| 2010/0078680 | A1 | | 4/2010 | Cheng et al. |
| 2013/0034924 | A1 | | 2/2013 | Lochtefeld |
| 2013/0252361 | A1 | | 9/2013 | Li et al. |

OTHER PUBLICATIONS

Cheng et al., "Aspect Ratio Trapping Heteroepitaxy for Integration of Germanium and Compound Semiconductors on Silicon", 2008 IEEE, 4 pages.
Spuesens et al., "Compact Integration of Optical Sources and Detectors on SOI for Optical Interconnects Fabricated in a 200 mm CMOS Pilot Line", Journal of Lightwave Technology, vol. 30, No. 11, Jun. 1, 2012, IEEE, pp. 1764-1770.
Hattori et al., "Heterogeneous Integration of Microdisk Lasers on Silicon Strip Waveguides for Optical Interconnects", IEEE Photonics Technology Letters, vol. 18, No. 1, Jan. 1, 2006, pp. 223-225.

(Continued)

*Primary Examiner* — Richard Booth
(74) *Attorney, Agent, or Firm* — Andrew G. Wakim; Louis J. Percello

(57) ABSTRACT

A method of forming a laser on silicon using aspect ratio trapping (ART) growth. The method may include; forming a first insulator layer on a substrate; etching a trench in the first insulator layer exposing a top surface of the substrate; forming a buffer layer in the trench using ART growth; forming a laser on the buffer layer, the laser includes at least an active region and a top cladding layer; and forming a top contact on the top cladding layer and a bottom contact on the substrate.

20 Claims, 13 Drawing Sheets

(56) References Cited

OTHER PUBLICATIONS

Yang et al., "High-Performance In0.5Ga0.5As/GaAs Quantum-Dot Lasers on Silicon With Multiple-Layer Quantum-Dot Dislocation Filters", IEEE Transactions on Electron Devices, vol. 54, No. 11, Nov. 2007, pp. 2849-2855.

Mi et al., "High-Performance Quantum Dot Lasers and Integrated Optoelectronics on Si", Invited Paper, vol. 97, No. 7, Jul. 2009, Proceedings of the IEEE, pp. 1239-1249.

Spuesens et al., "Realization of a Compact Optical Interconnect on Silicon by Heterogeneous Integration of III-V", IEEE Photonics Technology Letters, vol. 25, No. 14, Jul. 15, 2013, pp. 1332-1335.

* cited by examiner

LASER STRUCTURE ON SILICON USING ASPECT RATIO TRAPPING GROWTH

BACKGROUND

The present invention generally relates to semiconductor device manufacturing, and more particularly to the formation of a laser structure on silicon using aspect ratio trapping (ART) growth.

As micro-electronic systems continue to scale down, the resultant electrical interconnect density would have to accommodate increased power dissipation, signal delay and cross-talk, while running at extremely high clock speeds. Current trends indicate that in less than a decade the power consumed by interconnects might become the limiting factor in determining the switching speeds in integrated circuits. To overcome these problems the integration of optical interconnects and systems alongside conventional Silicon (Si) based micro-electronic circuits would be a major step forward. Light based intra and inter-chip communication would diminish latency considerably and reduce power consumption by eliminating capacitive interconnect loss. Improved opto-electronic integration can also help increase the speed of transceiver circuits used in optical communication systems, thereby increasing the overall bandwidth.

SUMMARY

According to one embodiment of the present invention, a method is provided. The method may include forming a first insulator layer on a substrate; etching a trench in the first insulator layer exposing a top surface of the substrate; forming a buffer layer in the trench using aspect ratio trapping (ART) growth; forming a laser on the buffer layer, the laser includes at least an active region and a top cladding layer; and forming a top contact on the top cladding layer and a bottom contact on the substrate.

According to another embodiment of the present invention, a method is provided. The method may include forming a set of dielectric rods on a substrate; forming a buffer layer on the substrate using ART growth, wherein a portion of the buffer layer is between the dielectric rods, and growth defects terminate at a surface of the dielectric rods; forming a semiconductor layer on the buffer layer, the semiconductor layer includes an active region between the dielectric rods; forming a first doped region and a second doped region in the semiconductor layer, the first and second doped regions are on opposite sides of the active region, the first and second doped regions each have a connecting region and a contact region, the connecting region is closer to the active region than the contact region; forming a first contact in the contact region of the first doped region and a second contact in the contact region of the second doped region; and removing the dielectric rods and a portion of the buffer layer, wherein the active region does not directly contact a remaining buffer layer.

According to another embodiment of the present invention, a method is provided. The method may include forming a set of dielectric rods on a substrate; forming a buffer layer on the substrate using ART growth, wherein a portion of the buffer layer is between the dielectric rods, and growth defects terminate at a surface of the dielectric rods; forming a laser on the buffer layer, the laser includes a bottom cladding layer on the buffer layer, a semiconductor layer on the bottom cladding layer, and a top cladding layer on the semiconductor layer, wherein the laser includes an active region, the top cladding layer includes a top contact region, and the substrate includes a bottom contact region; forming a top contact on the top cladding layer in the top contact region and a bottom contact on the substrate in the bottom contact region; and removing the dielectric rods and a portion of the buffer layer, wherein a remaining portion of the buffer layer is between the active region and the substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
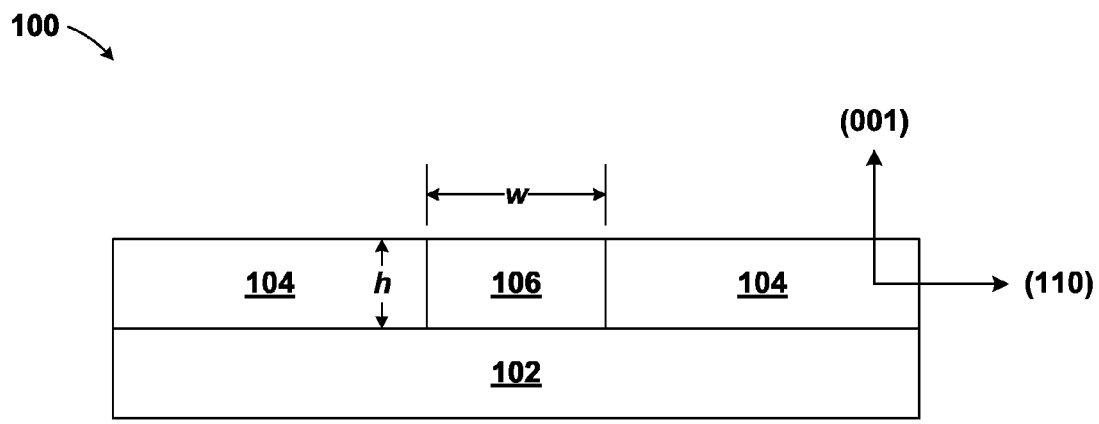
FIG. 1a is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of a laser structure on silicon using aspect ratio trapping (ART) growth. Ideally, it may be desirable to form a laser structure of a III-V material on silicon without defects in a bottom cladding layer. One way to fabricate a laser structure on silicon without defects in a bottom cladding layer is to form a buffer layer under the bottom cladding layer using ART growth. One embodiment by which to form a laser structure on silicon using ART growth is described in detail below referring to the accompanying drawings FIGS. 1a-3.

Figure 1B:
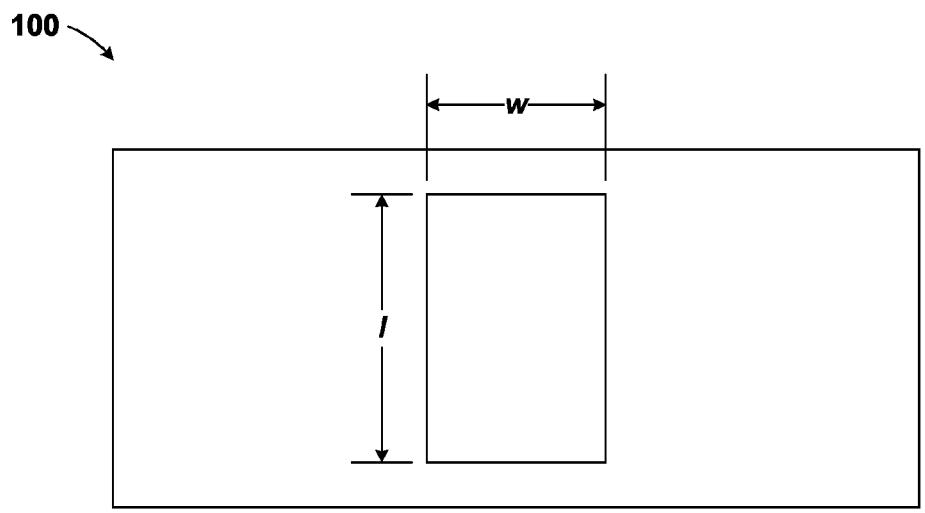
FIG. 1b is a top view of the semiconductor structure, according to an exemplary embodiment.

With reference to FIGS. 1a and 1b, a demonstrative illustration of a structure 100 is provided during an intermediate step of a method of fabricating a laser structure on silicon using ART growth, according to an embodiment. More specifically, the method can start by forming a buffer layer 106 in a first insulator layer 104, wherein the buffer layer 106 and the first insulator layer 104 are on a substrate 102. It should be noted, FIG. 1a is a front view of the structure 100 and FIG. 1b is a top view of the structure 100.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. In an embodiment, the substrate 102 is a bulk silicon substrate. The substrate 102 may include, for example; an n-type, p-type, or undoped semiconductor material and may have a monocrystalline, polycrystalline, or amorphous structure.

The first insulator layer 104 may be formed on the substrate 102 using any deposition techniques known in the art, such as, for example; ion implantation, thermal or plasma oxidation or nitridation, chemical vapor deposition, and/or physical vapor deposition. The first insulator layer 104 may be any dielectric material known in the art, such as, for example; oxides, nitrides, or oxynitrides. The first insulator layer 104 may have a thickness ranging from about 2 μm to about 6 μm, but other thicknesses may be used. In an embodiment, the first insulator layer 104 is $SiO_2$ with a thickness of about 6 μm. In another embodiment, the first insulator layer 104 may include multiple dielectric layers or a stack of dielectric layers including a silicon oxide layer and/or a silicon nitride layer. It should be noted; the first insulator layer 104 may also be referred to as a buried dielectric layer or a buried oxide (BOX) layer. The first insulator layer 104 may have a horizontal crystalline structure with a (110) orientation and a vertical crystalline structure with a (001) orientation, as illustrated.

A trench may be formed in the first insulator layer 104 using any etching technique known in the art, such as, for example, a photolithography and/or reactive ion etching process. The trench may expose a top surface of the substrate 102. The trench may be formed in such a way to allow for ART growth of subsequently grown semiconductors. The ART process may utilize deep trenches to epitaxially grow semiconductor materials, such as, for example III/V group materials, where the semiconductor has a different lattice structure than the seed layer. The lattice mismatch generally causes misfit dislocations (i.e., defects). The dislocations in a mismatched cubic semiconductor grown on a Si {100} surface in the near vicinity of a trench sidewall and bend toward the trench sidewall at approximately 30 degrees through 60 degrees. A predetermined depth may be necessary to trap defects, where the predetermined depth may be between about half of the trench width to about double the trench width. The predetermined depth may be less than the thickness of the first dielectric layer 104. In an embodiment, the trench width is about 2 µm and the trench height is about 6 µm.

The buffer layer 106 may be formed in the trench using any deposition technique known in the art, such as, for example, epitaxial growth, chemical vapor deposition, plasma enhanced chemical vapor deposition, atomic layer deposition, or physical vapor deposition. The buffer layer 106 may be any semiconductor material known in the art, such as, for example, IV semiconductors and/or III-V semiconductors. In an embodiment, the buffer layer 106 is AlGaAs. The buffer layer 106 may be doped in-situ and may be p-type or n-type. The buffer layer 106 may have a width (w) ranging from about 1 µm to about 2 µm, but other widths may be used. The buffer layer 106 may have a height (h) ranging from about 2 µm to about 6 µm, but other heights may be used. The buffer layer 106 may have a length (l) ranging from about 100 µm to about 200 µm, but other lengths may be used. It should be noted, the buffer layer 106 may be used as a bottom cladding layer for a subsequently formed laser.

Figure 2:
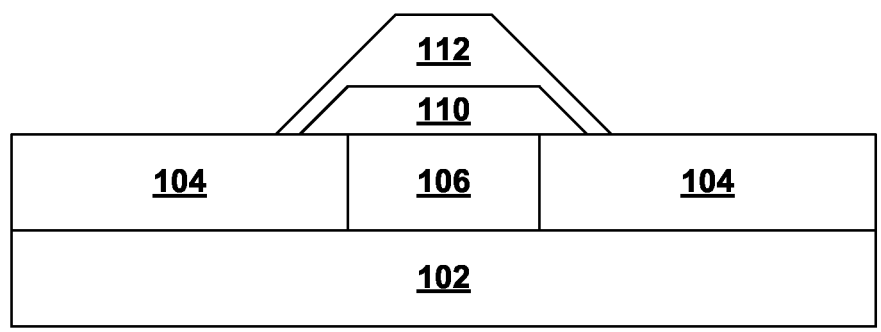
FIG. 2 is a cross section view of the semiconductor structure and illustrates the formation of an active region and a top cladding layer on a buffer layer, according to an exemplary embodiment.

With reference to FIG. 2, a demonstrative illustration of the structure 100 is provided during an intermediate step of the method of fabricating a laser structure on silicon using ART growth, according to an embodiment. More specifically, the method may include forming an active region 110 and a top cladding layer 112 on the buffer layer 106. It should be noted, the buffer layer 106, the active region 110, and the top cladding layer 112 may be subsequently referred to as a laser.

The active region 110 may be formed on the buffer layer 106 using any deposition technique known in the art, such as, for example, epitaxial growth, chemical vapor deposition, plasma enhanced chemical vapor deposition, atomic layer deposition, or physical vapor deposition. The active region 110 may include any semiconductor material known in the art, such as, for example, IV semiconductors and/or III-V semiconductors. In an embodiment, the active region 110 is GaAs formed using epitaxial growth. The active region 110 may form a trapezoidal shape if grown using epitaxy, depending on the crystalline orientation of the seed layer (e.g., the buffer layer 106). The active region 110 may have the same lattice structure as the buffer layer 106; however, the active region 110 may have a different bandgap.

The top cladding layer 112 may be formed on the active region 110 using any deposition technique known in the art, such as, for example, epitaxial growth, chemical vapor deposition, plasma enhanced chemical vapor deposition, atomic layer deposition, or physical vapor deposition. The top cladding layer 112 may include any semiconductor material known in the art, such as, for example, IV semiconductors and/or III-V semiconductors. In an embodiment, the top cladding layer 112 may be the same material as the buffer layer 106 (e.g., AlGaAs) grown using epitaxy forming a trapezoidal shape depending on the crystalline orientation of the seed layer (e.g., the active region 110). The top cladding layer 112 may be doped in-situ and may be p-type or n-type. In an embodiment, the top cladding layer 112 may have an opposite doping polarity from the buffer layer 106 (e.g., a p-type top cladding layer 112 and an n-type buffer layer 106). The top cladding layer 112 and the buffer layer 106 may be used as a barrier layer which may confine light in the active region 110.

Figure 3:
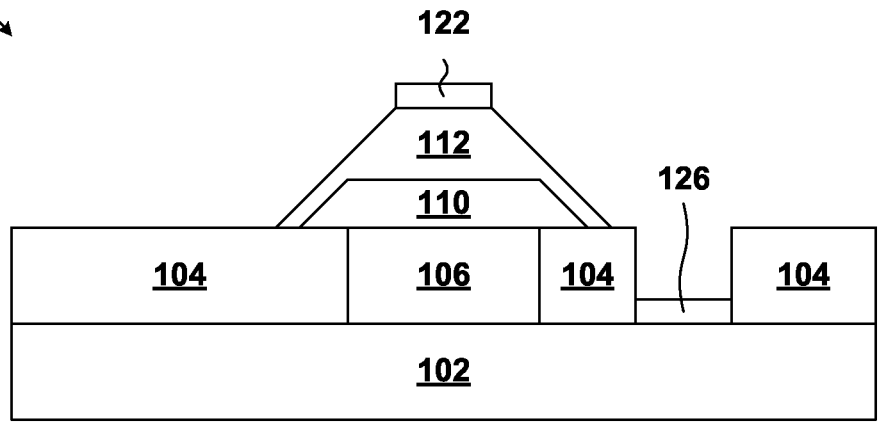
FIG. 3 is a cross section view of the semiconductor structure and illustrates the formation of a top contact on the top cladding layer and a bottom contact on a substrate, according to an exemplary embodiment.

With reference to FIG. 3, a demonstrative illustration of the structure 100 is provided during an intermediate step of the method of fabricating a laser structure on silicon using ART growth, according to an embodiment. More specifically, the method may include forming a bottom contact 126 and a top contact 122.

The bottom contact 126 may be formed by etching a trench through the first insulator layer 104 exposing a top surface of the substrate 102, using any etching technique known in the art, such as, for example, a photolithography and/or reactive ion etching process. The bottom contact 126 may be formed in the trench using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The bottom contact 126 may be any conductive material known in the art, such as, for example, tungsten, aluminum, silver, gold, alloys thereof, or any other conductive material. The bottom contact 126 may directly contact the substrate 102 and may not be in direct contact with the top cladding layer 112. A layer of silicide may line a bottom surface of the bottom contact 126.

The top contact 122 may be formed on the top cladding layer 112 using any contact formation technique known in the art, such as, for example, a mask and deposition process. The top contact 122 may be any conductive material known in the art, such as, for example, tungsten, aluminum, silver, gold, alloys thereof, or any other conductive material. A layer of silicide may line a bottom surface of the top contact 122. It should be noted, structure 100 may be a demonstrative illustration of an edge emitting laser, according to an embodiment.

Figure 4:
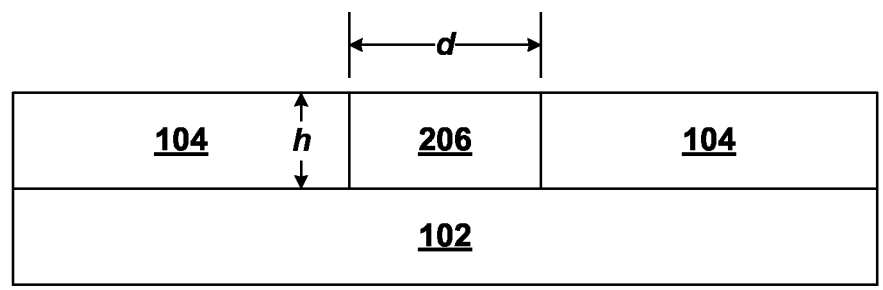
FIG. 4 is a cross section view of an alternative semiconductor structure, according to an exemplary embodiment.

With reference to FIG. 4, a demonstrative illustration of a structure 200 is provided during an intermediate step of the method of fabricating a laser structure on silicon using ART growth, according to an embodiment. More specifically, the method can start by forming a buffer layer 206 in the first insulator layer 104, wherein the buffer layer 206 and the first insulator layer 104 are on the substrate 102.

A trench may be formed in the first insulator layer 104 using any etching technique known in the art, such as, for example, a photolithography and/or reactive ion etching process. The trench may expose a top surface of the substrate 102. The trench may be formed in such a way to allow for ART growth of subsequently grown semiconductors. The trench may have a depth ranging from about 2 µm to about 6 µm, but other depths may be used. The trench may have a diameter (d) ranging from about 1 µm to about 2 µm, but other diameters may be used. In an embodiment, a trench diameter (d) is about 2 µm and the trench depth is about 6 µm.

The buffer layer 206 may be formed in the trench using any deposition technique known in the art, such as, for example, epitaxial growth, chemical vapor deposition, plasma enhanced chemical vapor deposition, atomic layer deposition, or physical vapor deposition. The buffer layer 206 may be any semiconductor material known in the art, such as, for example, Si, Ge, SiGe, SiC, SiGeC, InAs, GaAs, InP or other semiconductors. In an embodiment, the buffer layer 206 is a III-V semiconductor. The buffer layer 106 may have a diameter (d) ranging from about 1 µm to about 2 µm, but other diameters may be used. The buffer layer 106 may have a height (h) ranging from about 2 µm to about 6 µm, but other heights may be used.

Figure 5:
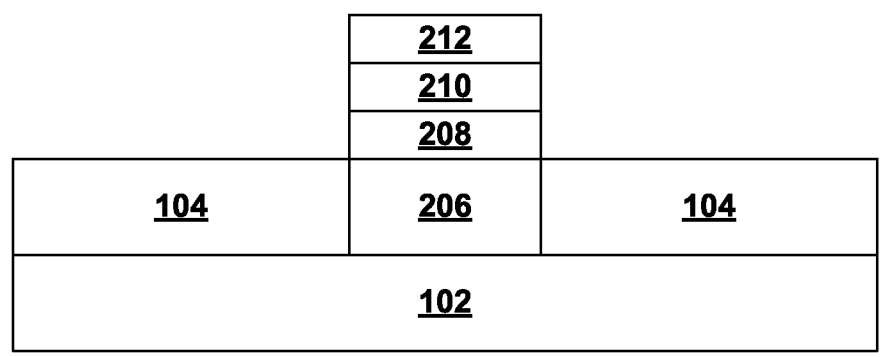
FIG. 5 is a cross section view of the semiconductor structure and illustrates the formation of a laser on a buffer layer, according to an exemplary embodiment.

With reference to FIG. 5, a demonstrative illustration of the structure 200 is provided during an intermediate step of the method of fabricating a laser structure on silicon using ART growth, according to an embodiment. More specifically, the method may include forming a laser on the buffer layer 206.

The laser may include (from bottom to top) a bottom cladding layer 208, an active region 210, and a top cladding layer 212. The bottom cladding layer 208 may be formed on the buffer layer 206 using any deposition technique known in the art, such as, for example, epitaxial growth, chemical vapor deposition, plasma enhanced chemical vapor deposition, atomic layer deposition, or physical vapor deposition. The bottom cladding layer 208 may be any semiconductor material known in the art, such as, for example, IV semiconductors and/or III-V semiconductors. In an embodiment, the bottom cladding layer 208 is AlGaAs and has a similar diameter as the buffer layer 206 (e.g., 2 µm).

The active region 210 may be formed on the bottom cladding layer 208 using any deposition technique known in the art, such as, for example, epitaxial growth, chemical vapor deposition, plasma enhanced chemical vapor deposition, atomic layer deposition, or physical vapor deposition. The active region 210 may include any semiconductor material known in the art, such as, for example, IV semiconductors and/or III-V semiconductors. In an embodiment, the active region 210 is GaAs formed using epitaxial growth. The active region 210 may have a similar diameter as the bottom cladding layer (e.g., 2 µm). The active region 210 may have the same lattice structure as the bottom cladding layer 208; however, the active region 210 may have a different bandgap.

The top cladding layer 212 may be formed on the active region 210 using any deposition technique known in the art, such as, for example, epitaxial growth, chemical vapor deposition, plasma enhanced chemical vapor deposition, atomic layer deposition, or physical vapor deposition. The top cladding layer 212 may include any semiconductor material known in the art, such as, for example, IV semiconductors and/or III-V semiconductors. In an embodiment, the top cladding layer 212 may be the same material as the bottom cladding layer 208 (e.g., AlGaAs) grown using epitaxy and may have a similar diameter as the active region 210 (e.g., 2 µm). The top cladding layer 212 may be doped in-situ and may be p-type or n-type. In an embodiment, the top cladding layer 212 may have an opposite doping polarity from the bottom cladding layer 208 (e.g., a p-type top cladding layer 212 and an n-type bottom cladding layer 208). The top cladding layer 212 and the bottom cladding layer 208 may be used as a barrier layer which may confine light in the active region 210.

Figure 6:
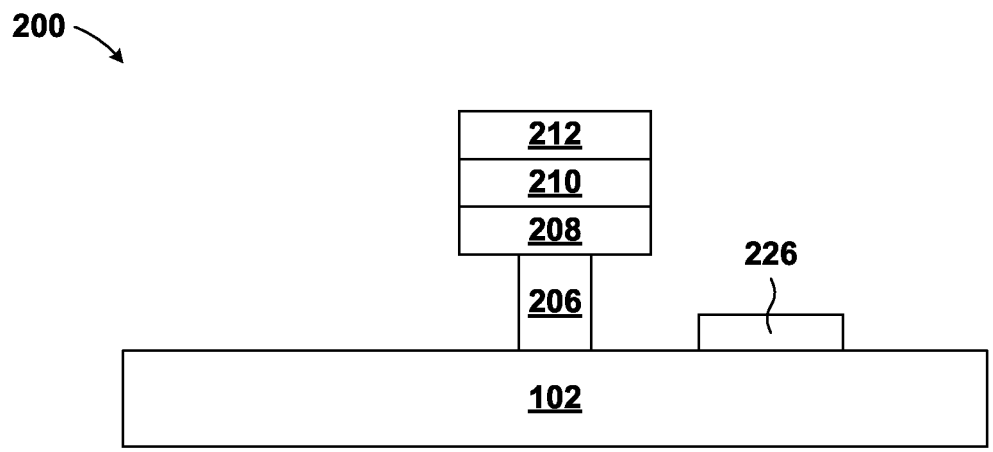
FIG. 6 is a cross section view of the semiconductor structure and illustrates the formation of a bottom contact on a substrate, according to an exemplary embodiment.

With reference to FIG. 6, a demonstrative illustration of the structure 200 is provided during an intermediate step of the method of fabricating a laser structure on silicon using ART growth, according to an embodiment. More specifically, the method may include forming a bottom contact 226 and removing the first insulator layer 104.

The bottom contact 226 may be formed by etching a trench through the first insulator layer 104 exposing a top surface of the substrate 102, using any etching technique known in the art, such as, for example, a photolithography and/or reactive ion etching process. The bottom contact 226 may be formed in the trench using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The bottom contact 226 may be any conductive material known in the art, such as, for example, tungsten, aluminum, silver, gold, alloys thereof, or any other conductive material. The bottom contact 226 may directly contact the substrate 102 and may not be in direct contact with the top cladding layer 112. A layer of silicide may line a bottom surface of the bottom contact 226. The first insulator layer 104 may be removed using any etching technique known in the art, such as, for example, a reactive ion etching process.

Figure 7:
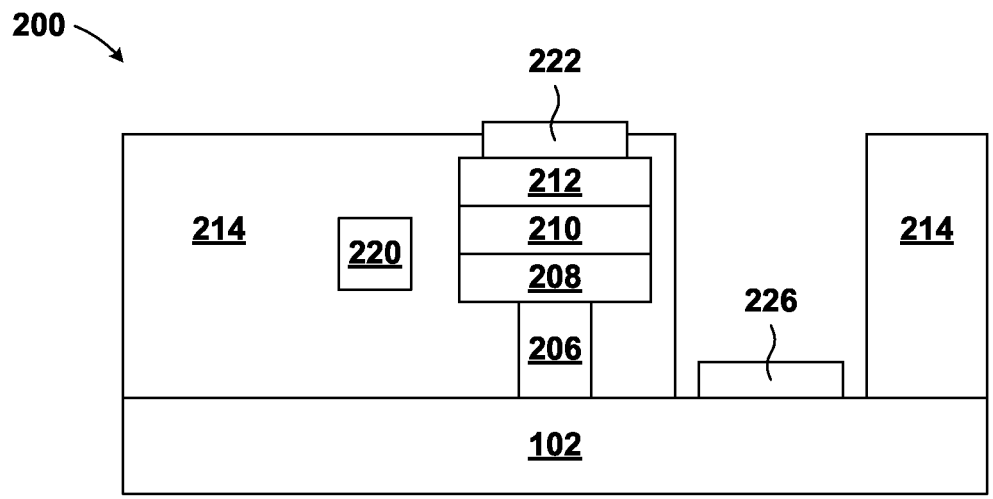
FIG. 7 is a cross section view of the semiconductor structure and illustrates the formation of a waveguide and a second insulator layer on the substrate, according to an exemplary embodiment.

With reference to FIG. 7, a demonstrative illustration of the structure 200 is provided during an intermediate step of the method of fabricating a laser structure on silicon using ART growth, according to an embodiment. More specifically, the method may include forming a top contact 222 on the top cladding layer 222 and a waveguide 220 in a second insulator layer 214.

The second insulator layer 214 may be formed on the laser, the bottom contact 226, and the substrate 102 using any deposition techniques known in the art, such as, for example; ion implantation, thermal or plasma oxidation or nitridation, chemical vapor deposition, and/or physical vapor deposition. The second insulator layer 214 may be any dielectric material known in the art, such as, for example; oxides, nitrides, or oxynitrides. In an embodiment, the second insulator layer 214 may be the same material as the first insulator layer 104 (e.g., SiO2). In another embodiment, the second insulator layer 214 may include multiple dielectric layers or a stack of dielectric layers including a silicon oxide layer and/or a silicon nitride layer.

The waveguide 220 may be formed in the second insulator layer 214 by etching a trench in the second insulator layer 214, depositing the waveguide 220 in the trench, and reforming the second insulator layer 214 on the waveguide 220. The trench may be formed in the second insulator layer 214 using any etching technique known in the art, such as, for example, a reactive ion etching process. The waveguide 220 may be deposited in the trench using any deposition technique known in the art, such as, for example, chemical vapor deposition, plasma enhanced chemical vapor deposition, atomic layer deposition, or physical vapor deposition. In an alternative embodiment, the waveguide 220 may be formed during the formation of the second insulator layer 214. The waveguide 220 may be any waveguide material known in the art, such as, for example, nitrides, oxides, or oxynitrides. In an embodiment, the waveguide 220 is SiN.

The top contact 222 may be formed by etching a trench through the second insulator layer 214 exposing a top surface of the top cladding layer 212, using any etching technique known in the art, such as, for example, a photolithography and/or reactive ion etching process. The top contact 222 may be formed in the trench using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The top contact 222 may be any conductive material known in the art, such as, for example, tungsten, aluminum, silver, gold, alloys thereof, or any other conductive material. A layer of silicide may line a bottom surface of the top contact 222.

The second insulator layer 214 may be removed from above the bottom contact 226 using any etching technique know in the art, such as, for example, a photolithography and/or reactive ion etching process. It should be noted, structure 200 may be a demonstrative illustration of micro-disk laser and may be similar to structure 100 in other respects, according to an embodiment.

Figure 8:
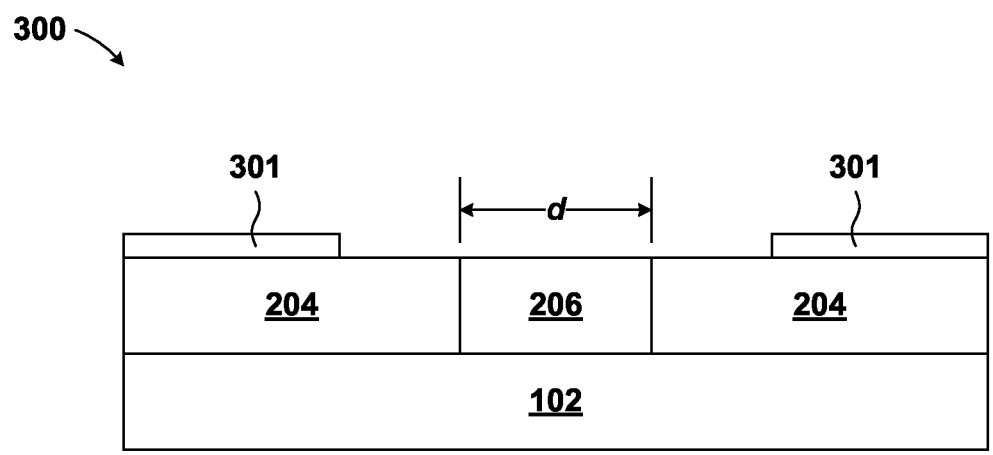
FIG. 8 is a cross section view of an alternative semiconductor structure, according to an exemplary embodiment.
Figure 9:
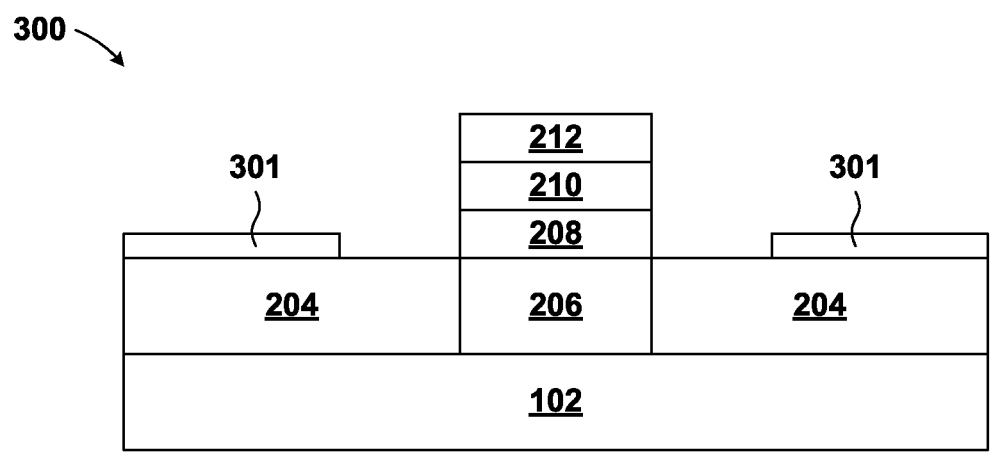
FIG. 9 is a cross section view of the semiconductor structure and illustrates the formation of a laser on a buffer layer, according to an exemplary embodiment.

With reference to FIGS. 8 and 9, a demonstrative illustration of a structure 300 is provided during an intermediate step of the method of fabricating a laser structure on silicon using ART growth, according to an embodiment. More specifically, the method can include forming a laser on a buffer layer 206 similar to the structure 200 illustrated in FIGS. 4 and 5. Structure 300 can include a semiconductor layer 301 on the first insulator layer 104 (e.g., a semiconductor-on-insulator substrate).

The semiconductor layer 301 may be formed on the first insulator layer 204 using any deposition technique known in the art, such as, for example, chemical vapor deposition, plasma enhanced chemical vapor deposition, atomic layer deposition, or physical vapor deposition. In an embodiment, the semiconductor layer 301 is formed before the buffer layer 206 and an opening is formed in the semiconductor layer 301 to allow for the formation of the buffer layer 206 in the first insulator layer 204 (as described above). The semiconductor layer 301 may be any semiconductor material known in the art, such as, for example, Si, Ge, SiGe, SiC, SiGeC, InAs, GaAs, InP or other semiconductors. In an embodiment, the semiconductor layer 301 is silicon. A top surface of the buffer layer 206 may be exposed by forming an opening in the semiconductor layer 301. The laser may be formed on the buffer layer 206. The laser may be the same laser illustrated in FIG. 5 (e.g., including the bottom cladding layer 208, the active region 110 and the top cladding layer 112).

Figure 10:
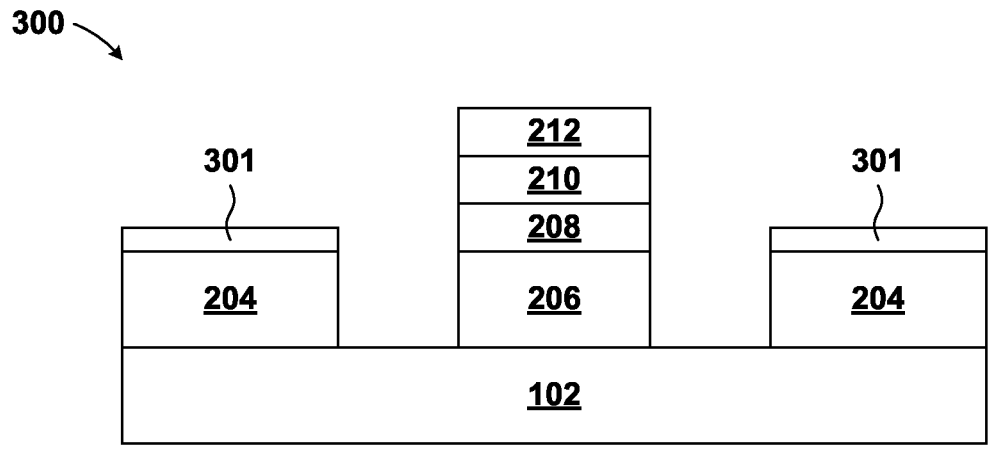
FIG. 10 is a cross section view of the semiconductor structure and illustrates the formation a trench around the laser, according to an exemplary embodiment.

With reference to FIG. 10, a demonstrative illustration of the structure 300 is provided during an intermediate step of the method of fabricating a laser structure on silicon using ART growth, according to an embodiment. More specifically, the method can include removing the semiconductor layer 301 and first insulator layer 204 on each side of the laser and buffer layer 206. The semiconductor layer 301 and the first insulator layer 204 may be removed using any etching technique known in the art, such as, for example, a reactive ion etching process which exposes a top surface of the substrate 102.

Figure 11:
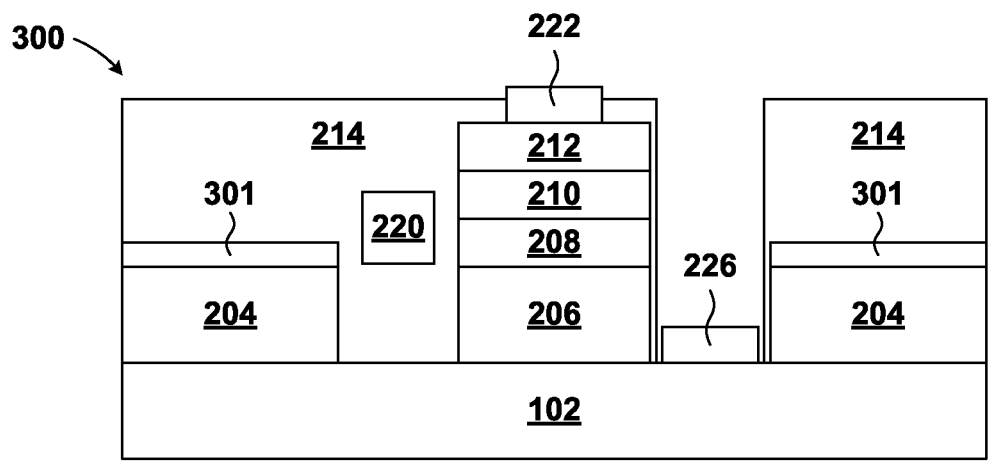
FIG. 11 is a cross section view of the semiconductor structure and illustrates the formation of a top and bottom contact on a top cladding layer and a substrate, respectively, according to an exemplary embodiment.

With reference to FIG. 11, a demonstrative illustration of the structure 300 is provided during an intermediate step of the method of fabricating a laser structure on silicon using ART growth, according to an embodiment. More specifically, the method can include forming the bottom contact 226, the top contact 222, and the waveguide 220 in the second insulator layer 214 (described in reference to FIG. 7). However, in structure 300, the semiconductor layer 301 may be present between a top surface of the first insulator layer 204 and a portion of the second insulator layer 214 above the first insulator layer 204.

Figure 12:
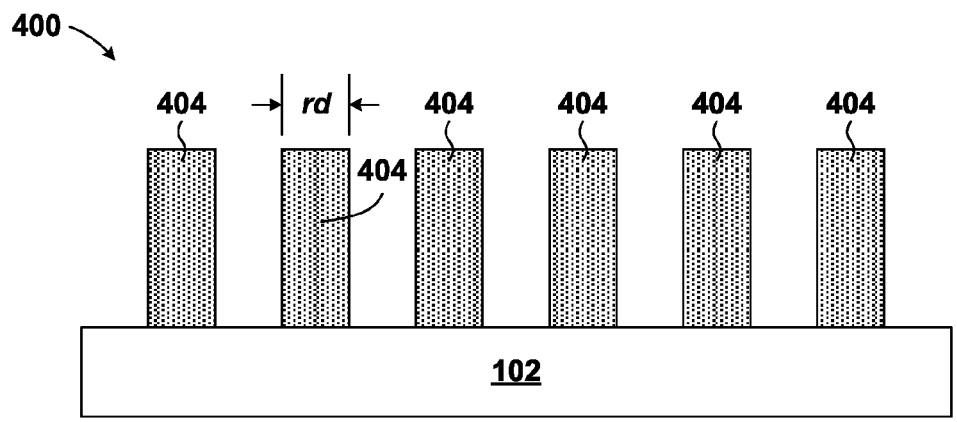
FIG. 12 is a cross section view of an alternative semiconductor structure, according to an exemplary embodiment.
Figure 13:
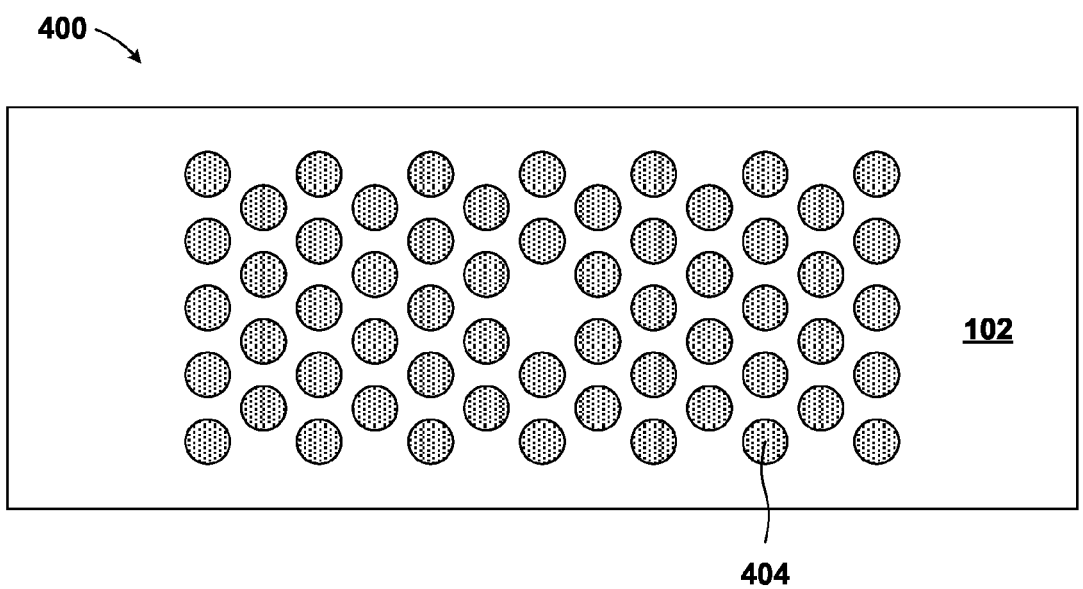
FIG. 13 is a top view of the semiconductor structure illustrated in FIG. 12, according to an exemplary embodiment.

With reference to FIGS. 12 and 13, a demonstrative illustration of a structure 400 is provided during an intermediate step of the method of fabricating a laser structure on silicon using ART growth, according to an embodiment. More specifically, the method can start by forming dielectric rods 404 on the substrate 102. It should be noted, FIG. 12 is a front view of structure 400 and FIG. 13 is a top view of structure 400.

The dielectric rods 404 may be formed by depositing and etching a dielectric layer on the substrate 102. The dielectric layer may be formed on the substrate 102 using any deposition technique known in the art, such as, for example, ion implantation, thermal or plasma oxidation or nitridation, chemical vapor deposition, or physical vapor deposition. The dielectric layer may be any dielectric material known in the art, such as, for example, oxides, nitrides, or oxynitrides. The dielectric layer can have a thickness ranging from about 100 nm to about 1 µm, but other thicknesses may be used. The dielectric rods 404 may be formed in the dielectric layer using any mask and etching technique known in the art, such as, for example, a photolithography and/or reactive ion etching process. The dielectric rods may have a rod diameter (rd) ranging from about 200 nm to about 300 nm, but other diameters may be used. In an embodiment, a center rod may be omitted to allow for subsequent growth of an active region for a laser.

Figure 14:
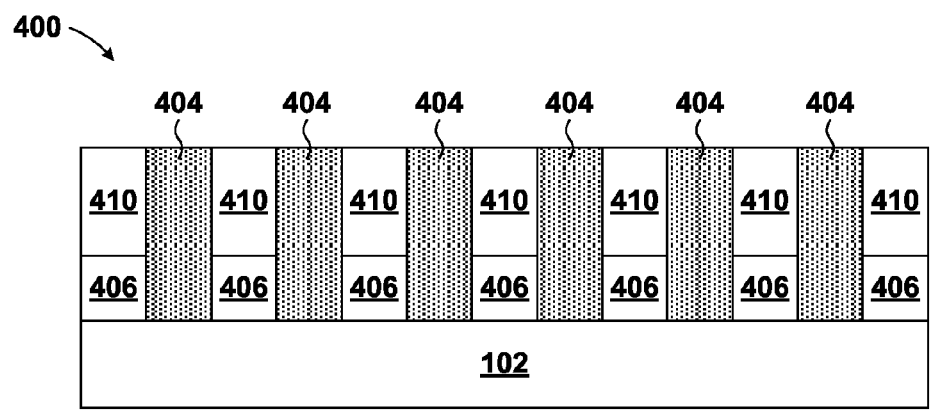
FIG. 14 is a cross section view of the semiconductor structure and illustrates the formation of a semiconductor layer on a buffer layer between dielectric rods, according to an exemplary embodiment.
Figure 15:
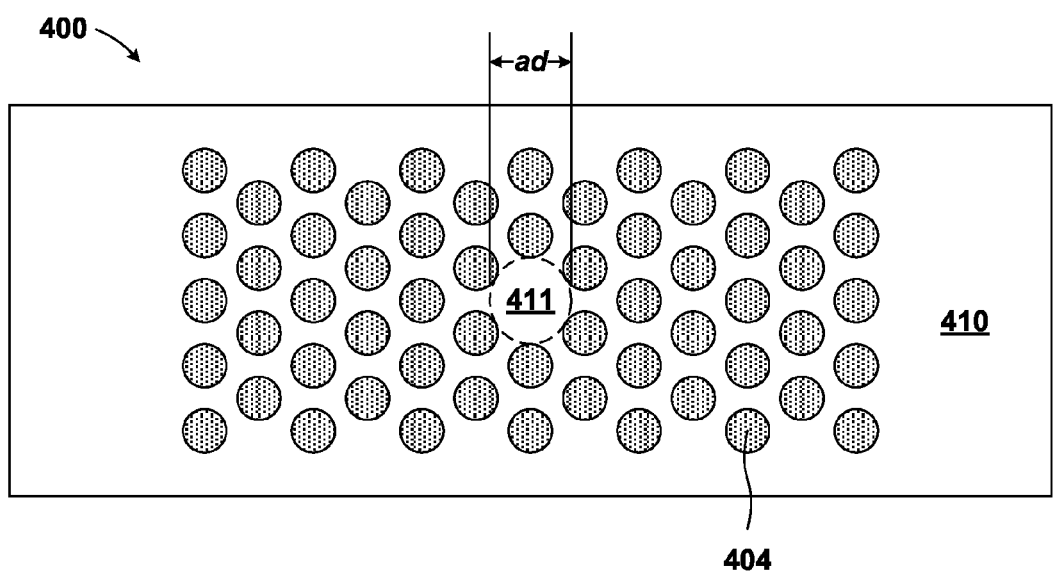
FIG. 15 is a top view of the semiconductor structure illustrated in FIG. 14, according to an exemplary embodiment.

With reference to FIGS. 14 and 15, a demonstrative illustration of the structure 400 is provided during an intermediate step of the method of fabricating a laser structure on silicon using ART growth, according to an embodiment. More specifically, the method may include forming a semiconductor layer 410 and a buffer layer 406 on the substrate 102. It should be noted, FIG. 14 is a front view of structure 400 and FIG. 15 is a top view of structure 400.

The buffer layer 406 may be formed on the substrate 102 using any deposition technique known in the art, such as, for example, epitaxial growth, chemical vapor deposition, plasma enhanced chemical vapor deposition, atomic layer deposition, or physical vapor deposition. The buffer layer 406 may be formed on the substrate 102 and between the dielectric rods 404, such that any defects formed in the buffer layer 406 may terminate at the surrounding dielectric rods 404 (i.e., dimensions for ART growth). The buffer layer 406 may be any semiconductor material known in the art, such as, for example, IV semiconductors and/or III-V semiconductors. In an embodiment, the buffer layer 106 is AlGaAs. The buffer layer 406 may have a thickness ranging from about 100 nm to about 600 nm, but other thicknesses may be used.

The semiconductor layer 410 may be formed on the buffer layer 406 and between the dielectric rods 404 using any deposition technique known in the art, such as, for example, epitaxial growth, chemical vapor deposition, plasma enhanced chemical vapor deposition, atomic layer deposition, or physical vapor deposition. The semiconductor layer 410 may be any semiconductor material known in the art, such as, for example, IV semiconductors and/or III-V semiconductors. In an embodiment, the semiconductor layer 410 is GaAs. The buffer layer 406 and the semiconductor layer 410 can fill in the area of the omitted dielectric rod (described above), such that an active region 411 may be formed between the dielectric rods 404. The active region 411 may have an active region diameter (ad) ranging from about 200 nm to about 300 nm, but other diameters may be used.

Figure 16:
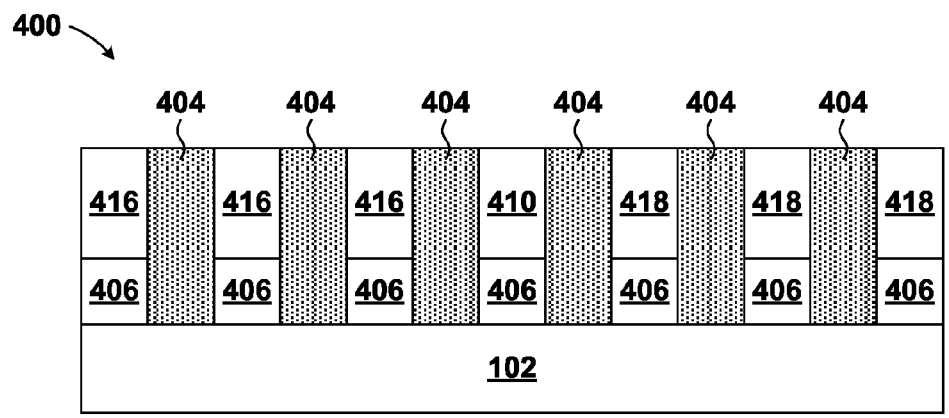
FIG. 16 is a cross section view of the semiconductor structure and illustrates the formation of a first and second doped region in the semiconductor layer, according to an exemplary embodiment.
Figure 17:
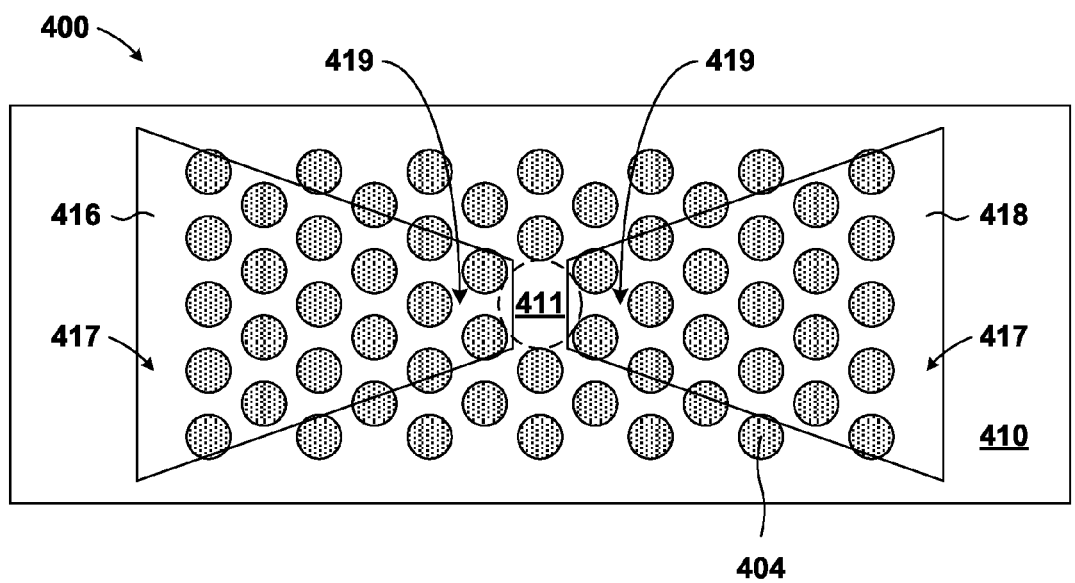
FIG. 17 is a top view of the semiconductor structure illustrated in FIG. 16, according to an exemplary embodiment.

With reference to FIGS. 16 and 17, a demonstrative illustration of the structure 400 is provided during an intermediate step of the method of fabricating a laser structure on silicon using ART growth, according to an embodiment. More specifically, the method may include forming a first doped region 416 and a second doped region 418. It should be noted, FIG. 16 is a front view of structure 400 and FIG. 17 is a top view of structure 400.

The first and second doped regions 416, 418 may be formed in the semiconductor layer 410 using any doping technique known in the art, such as, for example, photolithography and/or vapor-phase epitaxy where hydrogen sulfide can pass over the semiconductor layer 410 and incorporate into the first or second doped regions 416, 418. The first doped region 416 and the second doped region 418 may have an opposite doping polarity (e.g., the first doped region 416 may be n-doped and the second doped region 418 may be p-doped). The first and second doped regions 416, 418 may convert the entire semiconductor layer 410 into the respective doped regions, such that the first and second doped regions 416, 418 are directly on the buffer layer 406. The first and second doped regions 416, 418 may have a contact region 417 with a larger surface area for subsequent contact formation. The first and second doped regions 416, 418 may have a trapezoidal shape, such that the contact region 417 may tapper off to a smaller connecting region 419. The connecting region 419 may be near or in the active region 411 and the contact region 417 may be farther from the active region 411. The first doped region 416 may be n-doped and the second doped region 416 may be p-doped. The first doped region 416, the second doped region 418, and the active region 411 may form a laser and may subsequently be referred to as a laser or laser structure.

In an embodiment, the contact region 417 and the connecting region 419 may be directly connected through the first and second doped regions 416, 418. The dielectric rods 404 may have been used for ART growth of the active region 411 while leaving a connecting path from the contact region 417 to the connecting region 419.

Figure 18:
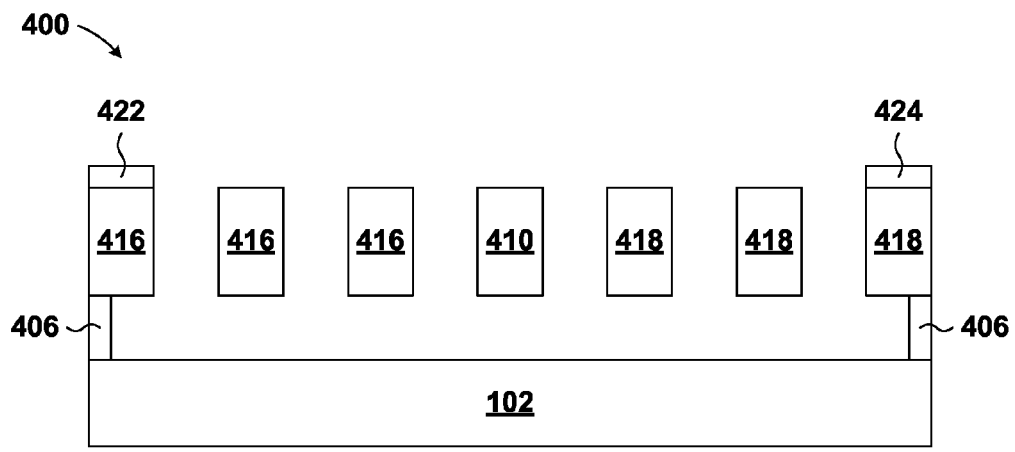
FIG. 18 is a cross section view of the semiconductor structure and illustrates the formation of a first and second contact on the semiconductor layer, according to an exemplary embodiment.
Figure 19:
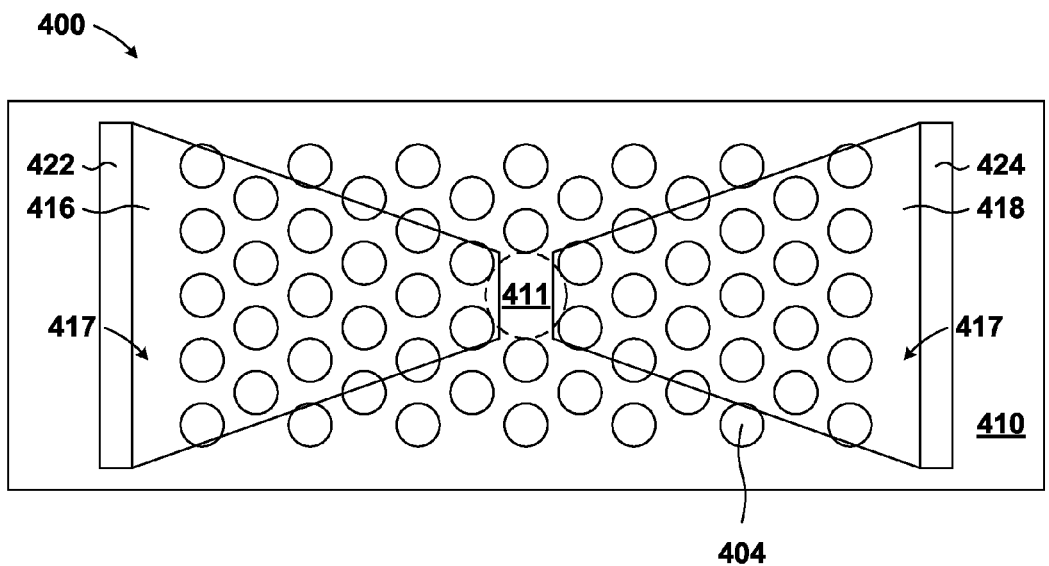
FIG. 19 is a top view of the semiconductor structure illustrated in FIG. 18, according to an exemplary embodiment.

With reference to FIGS. 18 and 19, a demonstrative illustration of the structure 400 is provided during an intermediate step of the method of fabricating a laser structure on silicon using ART growth, according to an embodiment. More specifically, the method may include forming a first and second contact 422, 424 and removing the dielectric rods 404 and a portion of the buffer layer 406. It should be noted, FIG. 18 is a front view of structure 400 and FIG. 19 is a top view of structure 400.

The first and second contact 422, 424 may be formed in the contact region 417 of the first and second doped regions 416, 418, respectively, using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The first and second contact 422, 424 may be any conductive material known in the art, such as, for example, tungsten, aluminum, silver, gold, alloys thereof, or any other conductive material.

The dielectric rods 404 may be removed using any etching technique known in the art, such as, for example, a wet or dry etching process. The dielectric rods 404 may be removed using an isotropic etching technique selective to the first and second doped regions 416, 418, the semiconductor layer 410 and may use the buffer layer 406 as an etch stop. The portion of the buffer layer 406 may be removed using any etching technique known in the art, such as, for example, a wet or dry etching process. The portion of the buffer layer 406 may include portions of the buffer layer 406 under the active region and portions of the first and second doped regions 416, 418. A portion of the buffer layer 406 may remain underneath the contact regions 417 for structural support.

Figure 20:
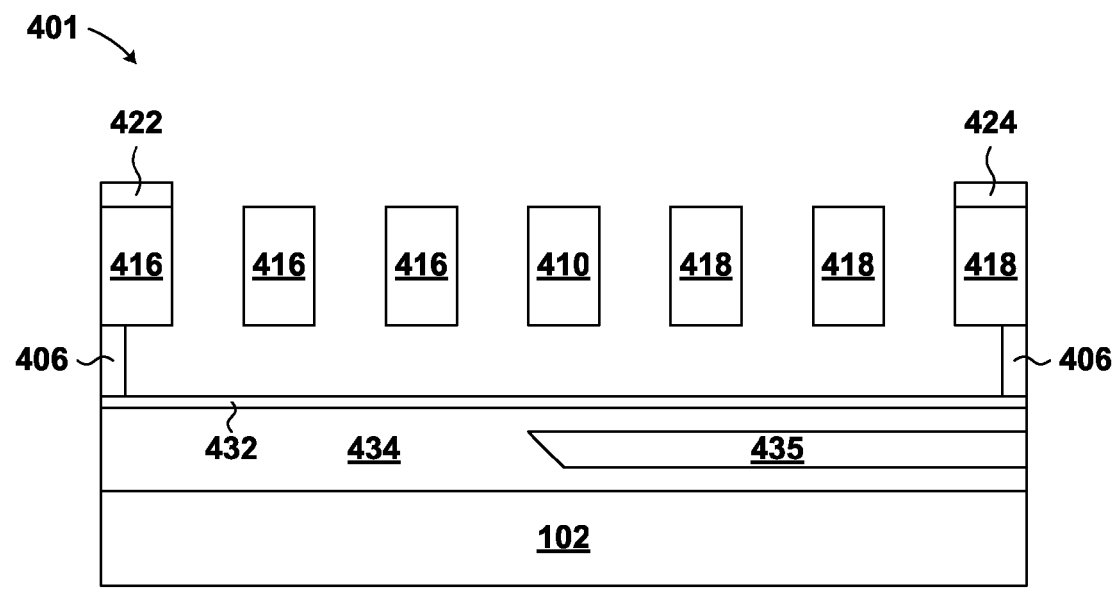
FIG. 20 is a cross section view of an alternative semiconductor structure, according to an exemplary embodiment.

With reference to FIG. 20, a demonstrative illustration of a structure 401 is provided during an intermediate step of the method of fabricating a laser structure on silicon using ART growth, according to an embodiment. More specifically, the method may include an SOI substrate having a silicon layer 432 on an oxide layer 434. A waveguide 435 may be embedded in the oxide layer 434 as is known in the art. It should be noted, structure 401 is an alternative embodiment of structure 400 having the SOI substrate rather than a bulk substrate and having an embedded waveguide 435. It should be noted, structure 400 and structure 401 may be embodiments having a horizontal p-n junction lasers.

Figure 21:
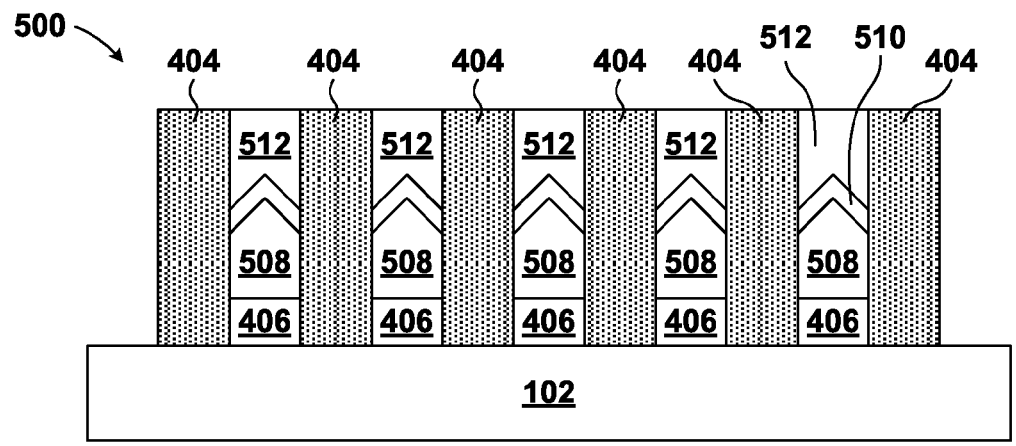
FIG. 21 is a cross section view of an alternative semiconductor structure, according to an exemplary embodiment.
Figure 22:
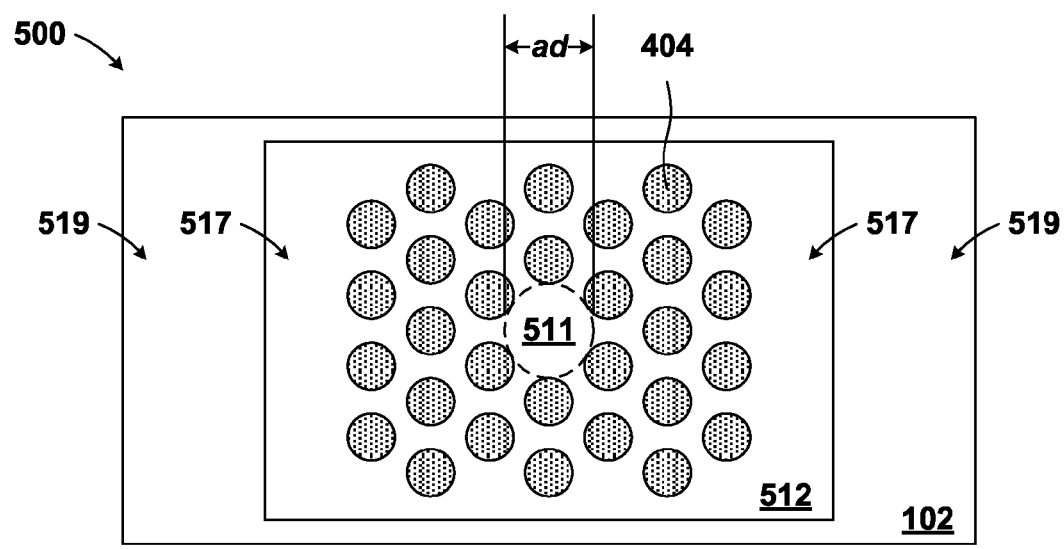
FIG. 22 is a top view of the semiconductor structure illustrated in FIG. 21, according to an exemplary embodiment.

With reference to FIGS. 21 and 22, a demonstrative illustration of a structure 500 is provided during an intermediate step of the method of fabricating a laser structure on silicon using ART growth, according to an embodiment. More specifically, the method may start by forming a laser on a structure similar to the structure 400 illustrated in FIGS. 12 and 13 having dielectric rods 404 on the substrate 102. It should be noted, structure 500 may illustrate an embodiment having a vertical p-n junction. Additionally, FIG. 21 is a front view of structure 500 and FIG. 22 is a top view of structure 500.

The laser can include a bottom cladding layer 508, an active region 511, and a top cladding layer 512. The bottom cladding layer 508 may be formed on the buffer layer 406 using any deposition technique known in the art, such as, for example, epitaxial growth, chemical vapor deposition, plasma enhanced chemical vapor deposition, atomic layer deposition, or physical vapor deposition. The bottom cladding layer 508 may be any semiconductor material known in the art, such as, for example, IV semiconductors and/or III-V semiconductors. The bottom cladding layer 508 may be doped in-situ and may be p-type or n-type. In an embodiment, the bottom cladding layer 508 is AlGaAs and may be p-doped.

The active region 511 may be formed by depositing a semiconductor layer 510 on the bottom cladding layer 508 using any deposition technique known in the art, such as, for example, epitaxial growth, chemical vapor deposition, plasma enhanced chemical vapor deposition, atomic layer deposition, or physical vapor deposition. The semiconductor layer 510 may include any semiconductor material known in the art, such as, for example, IV semiconductors and/or III-V semiconductors. In an embodiment, the semiconductor layer 510 is GaAs formed using epitaxial growth forming an angled top surface depending on the crystallographic orientation of the bottom cladding layer 508. The semiconductor layer 510 may have the same lattice structure as the bottom cladding layer 508; however, the semiconductor layer 510 may have a different bandgap. The active region 511 may include the area with an omitted dielectric rod (discussed above with reference to active region 411 in FIGS. 14 and 15). The active region 511 may have an active region diameter (ad) similar to the active region diameter (ad) described in reference to FIG. 15 (e.g., ranging from about 200 nm to about 300 nm).

The top cladding layer 512 may be formed on the semiconductor layer 510 using any deposition technique known in the art, such as, for example, epitaxial growth, chemical vapor deposition, plasma enhanced chemical vapor deposition, atomic layer deposition, or physical vapor deposition. The top cladding layer 512 may include any semiconductor material known in the art, such as, for example, IV semiconductors and/or III-V semiconductors. In an embodiment, the top cladding layer 512 may be the same material as the bottom cladding layer 508 (e.g., AlGaAs) grown using epitaxy. The top cladding layer 512 may be doped in-situ and may be p-type or n-type. In an embodiment, the top cladding layer 512 and the bottom cladding layer 508 may have an opposite doping polarity (e.g., a n-type top cladding layer 512 and an p-type bottom cladding layer 508). The top cladding layer 512 and the bottom cladding layer 508 may be used as a barrier layer which may confine light in the semiconductor layer 510.

In an embodiment, the top cladding layer 512 may have a top contact region 517 on adjacent sides of the active region 511 for subsequent contact formation. The substrate 102 may have a bottom contact region 519 on adjacent sides of the active region 511 for subsequent contact formation.

Figure 23:
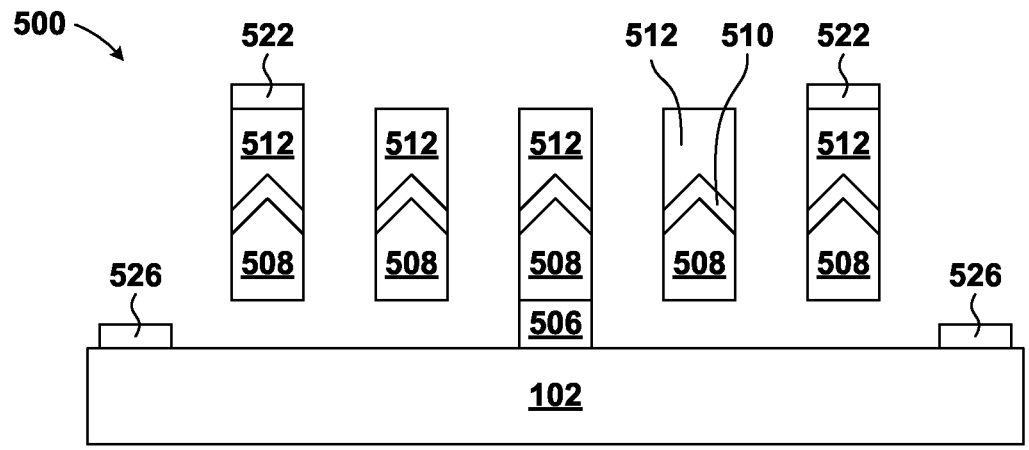
FIG. 23 is a cross section view of the semiconductor structure and illustrates the formation of a top and bottom contact on a top cladding layer and a substrate, respectively, according to an exemplary embodiment.
Figure 24:
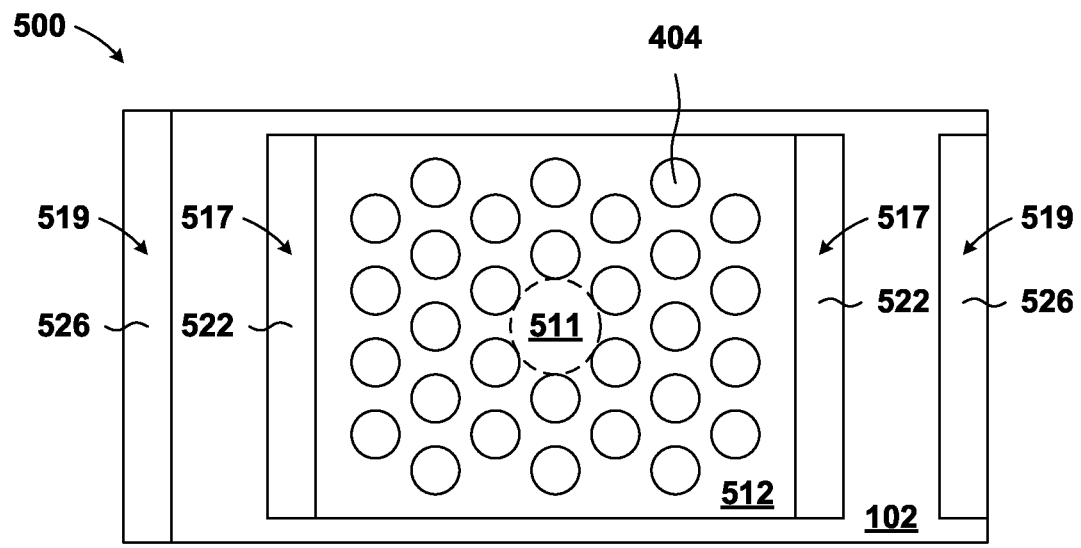
FIG. 24 is a top view of the semiconductor structure illustrated in FIG. 23, according to an exemplary embodiment.

With reference to FIGS. 23 and 24, a demonstrative illustration of the structure 500 is provided during an intermediate step of the method of fabricating a laser structure on silicon using ART growth, according to an embodiment. More specifically, the method may include forming a top and bottom contact 522, 526 in the top and bottom contact regions 517, 519, respectively, and removing the dielectric rods 404 and a portion of the buffer layer 406. It should be noted, FIG. 23 is a front view of structure 500 and FIG. 24 is a top view of structure 500.

The top and bottom contact 522, 526 may be formed in the top and bottom contact regions 517, 519, respectively, using any deposition technique known in the art, such as, for example, atomic layer deposition, molecular layer deposition, chemical vapor deposition, in-situ radical assisted deposition, metalorganic chemical vapor deposition, molecular beam epitaxy, physical vapor deposition, sputtering, plating, evaporation, ion beam deposition, electron beam deposition, laser assisted deposition, chemical solution deposition, or any combination thereof. The top and bottom contact 522, 526 may be any conductive material known in the art, such as, for example, tungsten, aluminum, silver, gold, alloys thereof, or any other conductive material.

The dielectric rods 404 may be removed in a similar fashion as described above, in reference to FIGS. 18 and 19. A portion of the buffer layer 506 may remain under the active region 511 for structural support and/or a conductive pathway for the laser.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a laser on a semiconductor comprising:
   forming a first insulator layer on a substrate;
   etching a trench in the first insulator layer exposing a top surface of the substrate;
   forming a buffer layer in the trench using aspect ratio trapping (ART) growth;
   forming a laser on the buffer layer, the laser includes at least an active region and a top cladding layer; and
   forming a top contact on the top cladding layer and a bottom contact on the substrate.

2. The method of claim 1, wherein the laser is an edge emitting laser.

3. The method of claim 1, wherein the laser is a micro-disk laser.

4. The method of claim 3, further comprising:
   forming a bottom cladding layer between the buffer layer and the active region;
   removing the first insulator layer;
   removing a portion of the buffer layer, wherein a buffer layer diameter is less than a laser diameter; and
   forming a waveguide in a second insulator layer, the second insulator layer is on the substrate, and the waveguide is adjacent to the laser.

5. The method of claim 4, further comprising:
   forming a semiconductor layer on the first insulator layer, wherein the semiconductor layer is between the first insulator layer and a portion of the second insulator layer above the first insulator layer.

6. The method of claim 1, wherein the top cladding layer is AlGaAs and the active region is GaAs.

7. The method of claim 1, wherein the substrate is silicon.

8. A method of forming a laser on a semiconductor comprising:
   forming a set of dielectric rods on a substrate;
   forming a buffer layer on the substrate using ART growth, wherein a portion of the buffer layer is between the dielectric rods, and growth defects terminate at a surface of the dielectric rods;
   forming a semiconductor layer on the buffer layer, the semiconductor layer includes an active region between the dielectric rods;
   forming a first doped region and a second doped region in the semiconductor layer, the first and second doped regions are on opposite sides of the active region, the first and second doped regions each have a connecting region and a contact region, the connecting region is closer to the active region than the contact region;
   forming a first contact in the contact region of the first doped region and a second contact in the contact region of the second doped region; and
   removing the dielectric rods and a portion of the buffer layer, wherein the active region does not directly contact a remaining buffer layer.

9. The method of claim 8, wherein a laser includes the first and second doped regions and the active region.

10. The method of claim 8, wherein the active region is in electrical connection with the first contact through the first doped region and the second contact through the second contact region.

11. The method of claim 8, wherein the first and second doped regions are AlGaAs and the active region is GaAs.

12. The method of claim 8, wherein the active region has a diameter between 200 nm and 300 nm.

13. The method of claim 8, wherein the substrate is a semiconductor-on-insulator (SOI) including a silicon layer on an oxide layer, the oxide layer is on a base substrate.

14. The method of claim 13, further comprising:
   forming a waveguide in the oxide layer, a portion of the waveguide is below the active region.

15. A method of forming a laser on a semiconductor comprising:
   forming a set of dielectric rods on a substrate;
   forming a buffer layer on the substrate using ART growth, wherein a portion of the buffer layer is between the dielectric rods, and growth defects terminate at a surface of the dielectric rods;
   forming a laser on the buffer layer, the laser includes a bottom cladding layer on the buffer layer, a semiconductor layer on the bottom cladding layer, and a top cladding layer on the semiconductor layer, wherein the laser includes an active region, the top cladding layer includes a top contact region, and the substrate includes a bottom contact region;
   forming a top contact on the top cladding layer in the top contact region and a bottom contact on the substrate in the bottom contact region; and
   removing the dielectric rods and a portion of the buffer layer, wherein a remaining portion of the buffer layer is between the active region and the substrate.

16. The method of claim 15, wherein the active region is in electrical connection with the top contact through the top cladding layer and with the bottom contact through the buffer layer and substrate.

17. The method of claim 15, wherein the top and bottom cladding layers are AlGaAs and the active region is GaAs.

18. The method of claim 15, wherein the active region has a diameter between 200 nm and 300 nm.

19. The method of claim 15, wherein the buffer layer is a III-V semiconductor.

20. The method of claim 15, wherein the substrate is silicon.

\* \* \* \* \*